(12) United States Patent
Street (10) Patent No.: US 8,077,235 B2
(45) Date of Patent: Dec. 13, 2011

(54) ADDRESSING OF A THREE-DIMENSIONAL, CURVED SENSOR OR DISPLAY BACK PLANE

(75) Inventor: Robert A. Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 996 days.

(21) Appl. No.: 12/017,974

(22) Filed: Jan. 22, 2008

(65) Prior Publication Data

US 2009/0184954 A1  Jul. 23, 2009

(51) Int. Cl.
 *H04N 3/14* (2006.01)
 *H04N 9/04* (2006.01)
(52) U.S. Cl. .......................... 348/294; 348/308
(58) Field of Classification Search .............. 348/294, 348/308; 250/208.1
See application file for complete search history.

(56) References Cited

U.S. PATENT DOCUMENTS

| | | | |
|---|---|---|---|
| 6,881,943 B1* | 4/2005 | Yegnashankaran | 250/208.1 |
| 2003/0141433 A1* | 7/2003 | Gordon | 250/208.1 |
| 2008/0151084 A1* | 6/2008 | Lu et al. | 348/294 |
| 2008/0151089 A1* | 6/2008 | Street et al. | 348/308 |

* cited by examiner

*Primary Examiner* — Gevell Selby
(74) *Attorney, Agent, or Firm* — Marger Johnson & McCollom, P.C.

(57) ABSTRACT

A method of forming a three-dimensional electronic device includes forming an array of pixels on a flexible two-dimensional surface, the array being formed according to a three-dimensional structure, the pixels having addressing lines accessible from at least one edge of the array, cutting the two-dimensional surface, the cuts being located to allow the two-dimensional surface to be shaped, and shaping the two-dimensional surface to form the three-dimensional surface, the array of pixels forming the three-dimensional electronic device. A three-dimensional electronic device has a flexible substrate containing an array of pixels, the substrate fabricated as a flat surface, then cut and shaped to form a three-dimensional surface, the array of pixels covering the three-dimensional surface in subarrays corresponding to segments of the three-dimensional surface, and addressing lines for each subarray being accessible along an edge of the three-dimensional surface. A method of forming a three-dimensional electronic device includes providing a flexible substrate, forming address lines on the substrate such that the address lines are accessible at an edge of the substrate, forming pixels on the address lines, the pixels being laid out in subarrays, the subarrays being determined by segments of a three-dimensional surface, and accommodating any cuts that will allow the flexible substrate to form the three-dimensional electronic device in the forming of addressing lines and pixels.

19 Claims, 5 Drawing Sheets

GATE LINES; DATA LINES    GATE LINES; DATA LINES

ADDRESSING OF A THREE-DIMENSIONAL, CURVED SENSOR OR DISPLAY BACK PLANE

BACKGROUND

Image sensors and displays are generally formed from crystalline silicon substrates, glass, or other somewhat rigid and brittle materials. These materials result in displays such as liquid crystal displays (LCD), and imaging arrays, such as charge-coupled devices (CCD), that are generally flat. Flat image sensors have limitations as to the field of view, and rely upon complex and expensive optical systems to widen the field of view, while a spherically curved sensor gives a wide field of view with simple optics. Curved displays may be required in certain applications depending on the positions from which it is intended to be viewed and the form of the structure that supports the display.

The ability to curve these arrays would allow for wide angle imaging systems, whether for sensing or viewing. Forming a curved array of pixels for either sensing or display gives rise to a number of issues. The advent of flexible electronics has made possible conical or cylindrical array surfaces, mostly based upon bending rectangular arrays. Formation of a spherical array is much more complex in several aspects, including manufacture, addressing, and image processing.

DETAILED DESCRIPTION OF THE EMBODIMENTS

Forming three-dimensional electronic devices directly on a curved surface causes difficulties because there is little or not processing equipment available that can process curved surfaces. For the purposes of the discussion here, 'three-dimensional' will refer to three-dimensional surfaces which are not flat. Obviously, a 'flat' electronics device has three-dimensions, but the surface upon which it is formed is flat and appears two-dimensional from a top view. For example, an array of pixels has an x component and a y component, but there is no z component.

'Pixel,' or picture element, as that term is used here refers to both display pixels, the individual cells of a display used to render an image, or an individual sensor element used in a sensor device. Examples of pixels include liquid crystal device (LCD) elements, or charge-coupled devices (CCD).

Some three-dimensional surfaces, such as cylinders may be formed using flat structures, such as by curling a rectangular device around to form a cylinder. However, forming an electronics device on a flat surface that can be formed into a three-dimensional device such as a sphere or hemisphere is far more complex. At any point on a cylinder there is always one direction on the surface which is straight and other directions which are curved. This discussion concerns fabricating the more general case in which the surface curves in all directions at any point. Such surfaces cannot be made by simply bending a flat sheet. It is possible to use a shape such as a geodesic dome to segment the surface into smaller two-dimensional shapes. These two-dimensional segments may then be laid out on a flexible substrate, an array of pixels formed on each segment and then the flexible substrate may be cut and shaped into the desired three-dimensional shape. Various aspects of this are discussed below.

It must be noted in the following discussions that reference may be made to a three-dimensional surface. This is not intended to imply that the device is actually formed around or on a three-dimensional surface. The three-dimensional surface is used as a model to determine the layout of the pixels; it is not necessarily an actual surface. Furthermore, when the discussion refers to a sphere or hemisphere, it is intended to apply to a spherical shape that might be only a portion of the spherical surface, and may be only an approximation to this shape.

This invention solves the problem of making the curved electronic array by choosing a shape that allows the array to be fabricated on a flat surface such that the surface can be cut and bent to form a sufficiently good approximation to the desired three-dimensional curved shape. One embodiment is based on the design of a geodesic dome.

Figure 1:
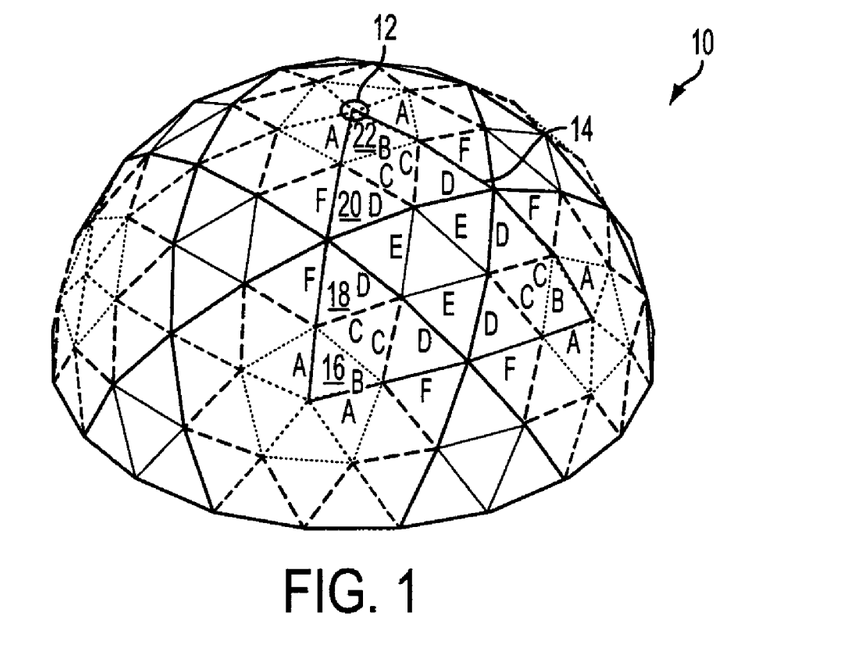
FIG. 1 shows an example of a segmented three-dimensional surface.

FIG. 1 shows a geodesic dome 10 segmented into triangles. At the vertex of the dome 12, one can see 5 larger triangles that come together to form the vertex. Each of these triangles has a symmetrical shape, as can be seen by triangle segment 14 defined by the vertices A-A, having sides of lengths A+F+F+A. Each letter designates a different length, A-F. These combinations of lengths for sides, as well as the combination of different lengths to form the various triangles are merely examples and no limitation should be implied from any particular structure used in this discussion.

Each of these sides is then divided into 4 further triangular subsegments. For example, the left side of the triangle 14 is divided to form left edges of the triangles 16, 18, 20 and 22. This is generally noted as a '4V' structure, because the original side of A+F+F+A is divided to form 4 new sides, A, F, F, A. If it were divided into two sides, for example, it would be noted as a 2V structure. This notation of mV may also be referred to as dome order.

It must be noted that this model employs triangles as both the segments such as 12 and the subsegments such as 16. Other shapes are of course possible. For example, a common segmentation of a sphere uses hexagons and pentagons, as in a soccer ball. Other shapes for both the segments and the subsegments include rectangles, squares, hexagons, pentagons, etc. There is no requirement that the segments and subsegments have the same shape. For example, a hexagon segment may have triangular subsegments.

One particular aspect of the geodesic dome, or half-dome, is that increasing the number of segments further increases the approximation of a spherical shape. In this example, the dome has 5-fold symmetry at the vertices. Some domes have 6-fold symmetry. Generally, the smallest dome that makes a reasonable approximation of a sphere is a 3V structure, which tiles a sphere with 180 subsegments, increasing to 720 subsegments for a 6V structure. FIG. 1 shows a 4V structure with triangular subsegments.

It is possible to make a useful curved back plane using less than a hemisphere and the angle at which the segments come together to form the curved surface may vary depending upon the desired final shape. The number of subsegments used for an array of elements in an electronic device depends upon the desired angle of the spherical surface and the dome order. The below table provides some data as to the numbers of subsegments and the angle achievable using various sizes of triangles for different dome orders.

| Dome order | Number of triangles in sphere | 2 × 2 (20T) fraction, angle | 3 × 3 (45T) fraction, angle | 4 × 4 (80T) fraction, angle |
|---|---|---|---|---|
| 3V | 180 | 0.111; 39° | 0.25; 60° | 0.44; 83° |
| 4V | 320 | 0.0625; 29° | 0.141; 44° | 0.25; 60° |
| 5V | 500 | 0.04; 23° | .09; 34° | 0.16; 47° |
| 6V | 720 | 0.028 | .0625; 29° | 0.111; 39° |

Figure 2:
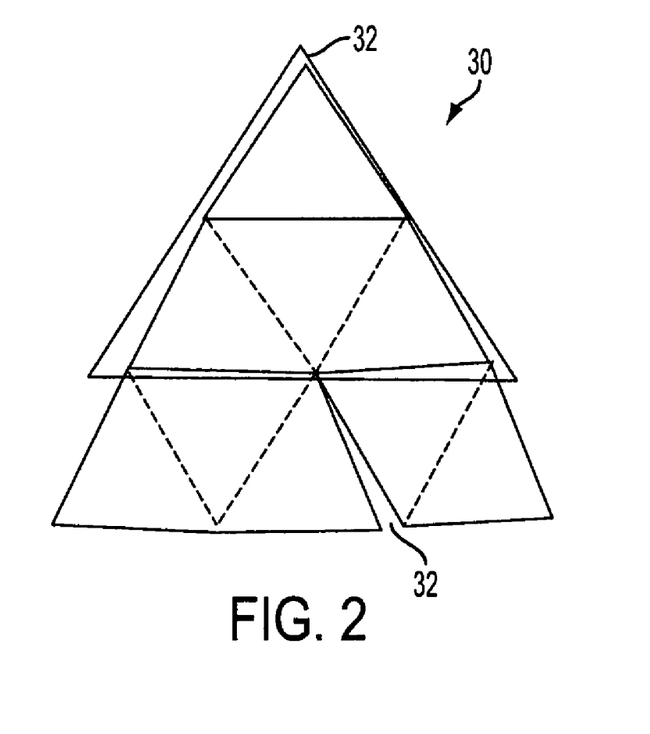
FIG. 2 shows an embodiment of a segment having subsegments.
Figure 3:
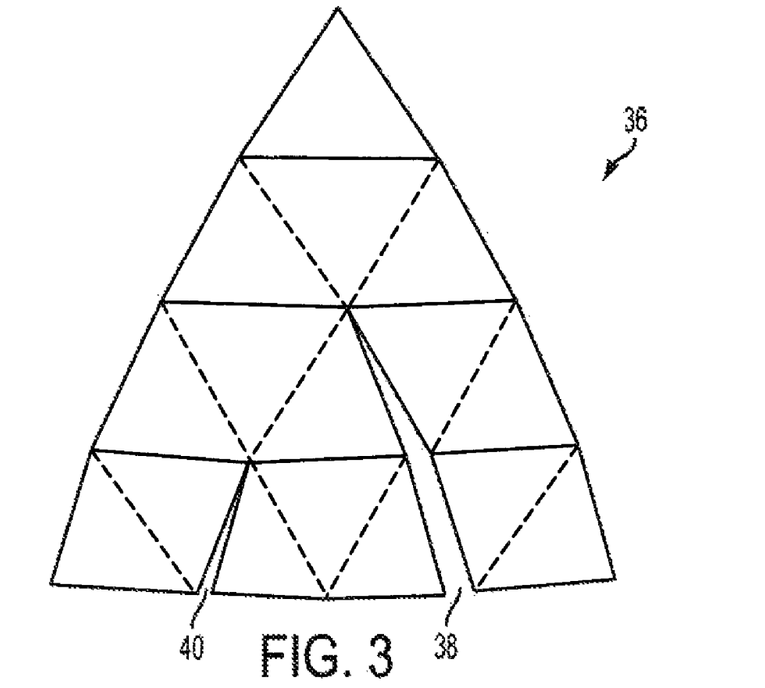
FIG. 3 shows an alternative embodiment of a segment having subsegments.

The large triangular segments of the geodesic dome of FIG. 1 have a curved shape and hence require cuts in order to be laid on a flat surface. FIGS. 2 and 3 show 3×3 and 4×4 triangular segments with the cut lines used to reshape the segments into curved segments. FIG. 2 shows an example of a 3×3 triangular segment 30. It is possible to use 2×2 triangles as a segment, as shown by the outlined triangular region 32. The 2×2 segment can be manufactured flat as it only consists of four triangles. This would result in a dome with 20 triangles. Generally, this may not be sufficient to give a good enough spherical approximation unless the angle is small.

The 3×3 unit of FIG. 2 makes a 45 triangle structure and is the smallest triangular segment that needs a cut to make it flat. The cut is shown at 34. The 4×4 segment 36 of FIG. 3 makes an 80 triangle structure and requires more cuts to 'make it flat.' Actually, the structure will be manufactured in a flat shape and then cut and shaped into the three-dimensional curved shape. An example of the cuts are shown at 38 and 40.

As can be seen by the table, the angle subtended by the spherical section decreases with increasing dome order up the progression 3V, 4V, 5V. The basic 3×3 triangle can be used to make a spherical arc of different angles. The table above provides the dome orders for designs that are close approximations to a complete sphere. If one is interested in just the spherical section, then the triangle sizes can be chosen to give any arbitrary angle. For example, sixty degree segments can be made with a 3×3 triangle in the 3V dome, or a 4×4 segment in the 5V dome. Generally, the higher order, more triangles segments provide better approximations to a sphere, but are harder to design because of their increased complexity.

Similar to the use of other shapes for the segments and subsegments, the same triangular design can be transformed into other curved shapes with some loss in the symmetry. For example, an oval shape may be made by a simple scaling of the triangles, and many arbitrary cured surfaces can be done the same way.

The number of triangles and the dome order, whether applied to a dome or other curved shapes, determine how accurately the structure approximates a spherical section. Given a line segment of length x on a circle of radius, R, the deviation of the center of the line from the arc, for small lengths x, is $x^2/8R$. Considering the curved image sensor application, in which the imaging optics forms a spherical shaped focus, if one assumes the focal plane is equally between the maximum and minimum deviation, then the depth error is half this amount, $$\Delta = x^2/16R.$$

This can be expressed in terms of the number, N, of triangles needed to create a sphere for a particular geodesic dome, as shown in the table, $$\Delta = \pi R/2N.$$

For the 4V dome with 320 triangles, $\Delta \sim R/70$, so the for a 3 centimeter (cm) radius, the deviation is 0.4 millimeters (mm).

Alternatively, a designer can require that $\Delta$ is no more than the pixels size, $D_P$, which is essentially the condition for perfect imaging with an f1 imaging lens. This condition sets a limit on the number of pixels along one side of the triangle, ($x = N_P D_P$), $$D_P/R < 16/N_P^2.$$

For a radius of 3 cm and pixel size of 0.3 mm, the limit would be 40 pixels, corresponding to an edge length of 1.2 cm for the 4V structure. This condition also relates the maximum number of pixels in a hemispherical sensor for a particular dome order, for the hemispherical example, $$N_{MAX} < 4N^2/\pi.$$

Therefore, a design that requires 500×500=250,000 pixels ideally requires a 5V dome. Larger f-number optics allows more pixels for a particular dome order.

The pixel array can be fabricated using the techniques of large area electronics on a flexible substrate such as plastic or metal foil. A typical pixel contains one or more thin film transistor (TFT) which can be fabricated from amorphous silicon, polycrystalline silicon, an organic semiconductor or other suitable material. In the case of an image sensor, the pixel also contains a photodiode made from similar materials. For active matrix addressing, there are address lines, typically contacting the gate and drain of one of the pixel TFTs.

Figure 4:
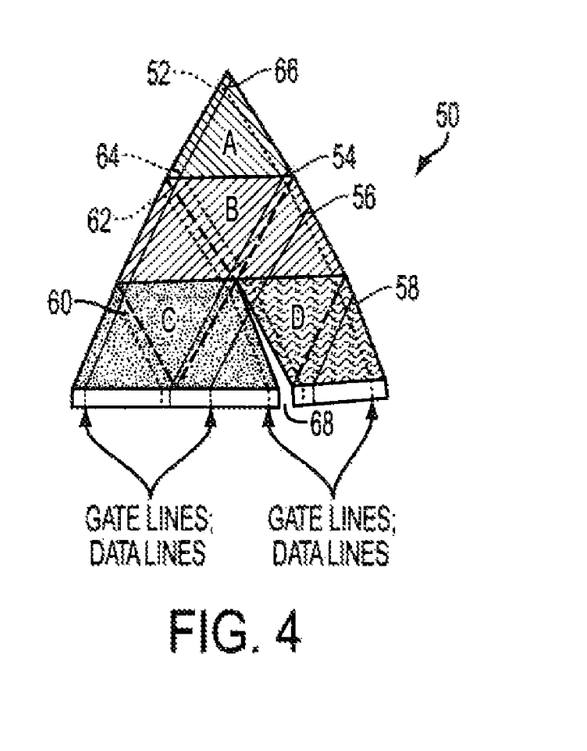
FIG. 4 shows an embodiment of a layout of addressing circuitry for a segment.

Hence, in order to address the individual pixels in the array, they should be laid out in a (n×m) matrix and there should be access to the address lines to connect to the external electronics. In this particular example, the triangular structure provides a solution to this problem. FIG. 4 shows how this is done for a 3×3 structure 50.

The address lines run parallel to the sides of the triangles so that they cover the whole surface and lead to the bottom free edge. In the example of FIG. 4, the gate lines 52, 54, 56 and 58 run down to the bottom edge parallel to the left edge of the triangle segment. Similarly, the data lines 60, 62, 64 and 66 run down to the bottom edge parallel to the right edge of the triangle segment.

It may be advantageous to lay out the pixels in four bocks as shown in FIG. 4. Each of the 3 triangle section blocks A, B and C is designed with the gate and data lines parallel to the opposite sides of the triangle. These are 'triangle' blocks in that they are at least a portion of a triangle. By using one fewer pixels in each row from the bottom row of the blocks to the top row of the blocks, the layout fits the structure.

The trapezoidal structure D does not layout the same as the opposite sides are nearly but not quite parallel. The adjustment could be done by adjusting the number of pixels in the rows to make a best fit. Alternatively, the pixels in that block could be shrunk slightly in size in each row to match the slow change in distance between the two sides.

Figure 5:
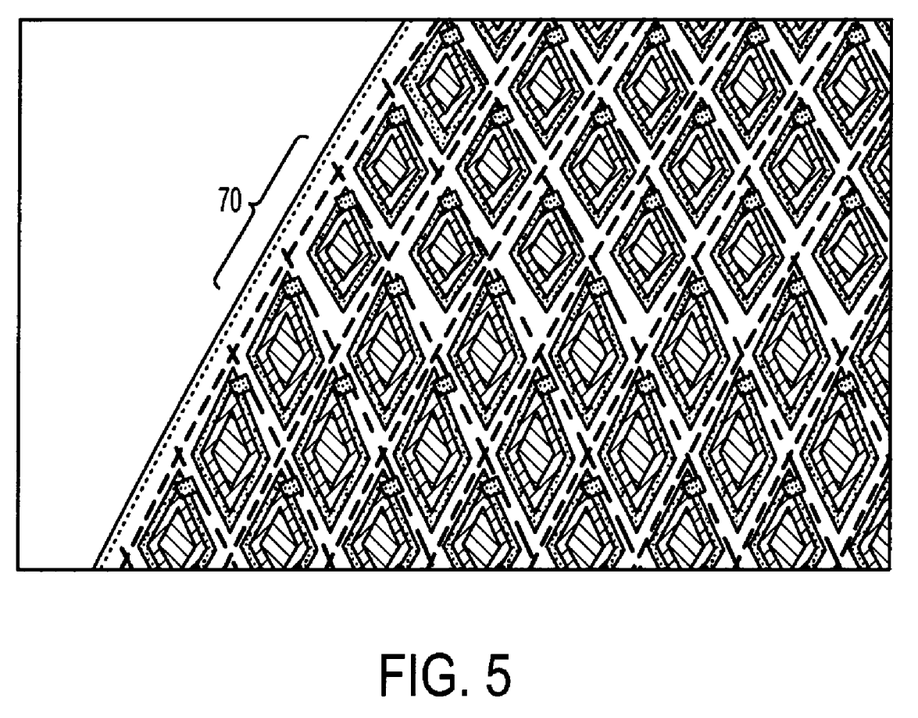
FIG. 5 shows an embodiment of a pixel array having a transition between blocks.

As yet another alternative, one could depart from the dome structure. If the trapezoidal shape is given sides of a length that matches the length of the side 68 of the triangular subsegment adjacent the cut, it can be laid out very precisely. The bottom left structure is adjusted in size, such that the bottom length A+B changes in size to 2A+B−C. This may result in a less than precise approximation of the spherical shape, but a better organization of the pixels. FIG. 5 shows a close-up of the pixel structure at the transition between two blocks, in this case the transition between blocks A and B, noticeable at region 70.

The layout also has to accommodate the cuts that will allow the flat structure to be shaped and curved. It may be desirable for the address lines that move from left to right, for example line 56 in FIG. 4, should continue through the cut. Several options may solve this problem. In one embodiment, the gate line 56 would loop around the center of the triangle. This may or may not require an additional metal layer in the manufacturing process so as to not interfere with the routing of the pixels.

In another embodiment, extra address lines could come out to the bottom of the lower right segment. This may also require extra metal during the manufacturing process. In yet another alternative, the lines could be routed in the cut area. The array could be designed with a flap where the segments overlap, and the flap could contain the address lines. In either case, the upper portion of line 56 would be connected to the contact area of block D and the lower portion of line 56 would be connected to the contact area of block C. The two portions can be connected together in the external electronics.

Figure 6:
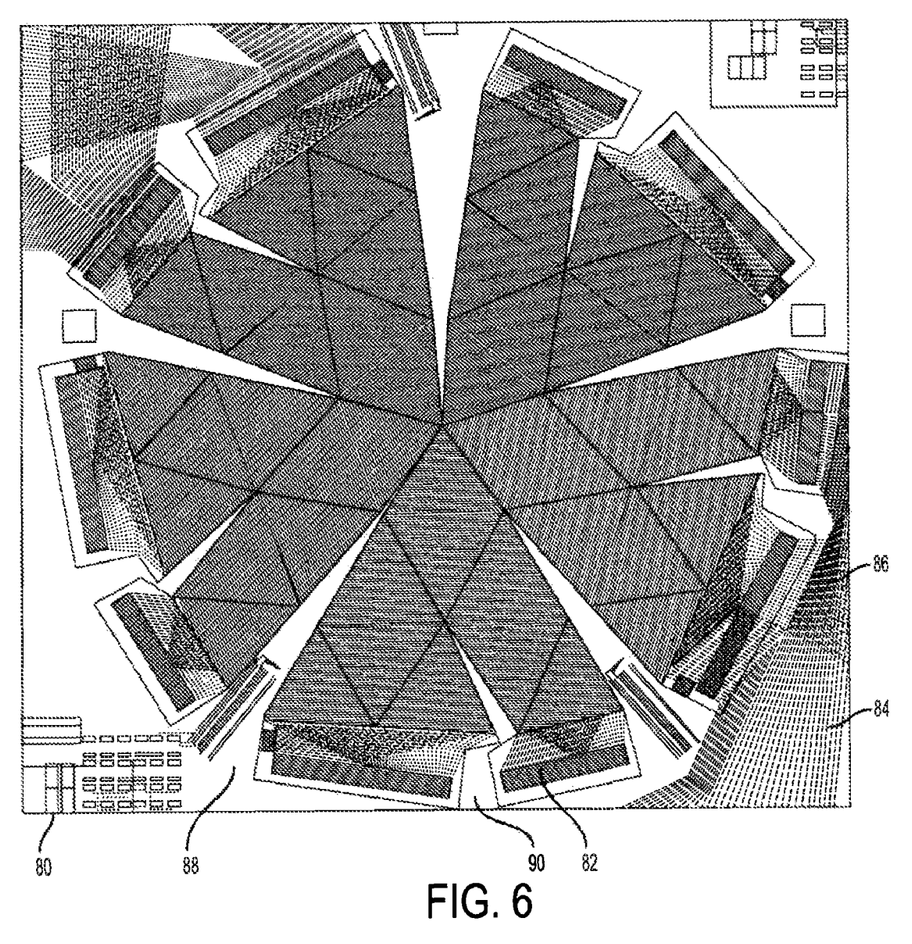
FIG. 6 shows an embodiment of a segmented, two-dimensional structure prior being formed into a three-dimensional structure.

FIG. 6 shows an embodiment of a complete layout of the 3×3 triangle, 3V dome structure and is a picture of the array design on a flat substrate. The unmarked white areas of the picture indicate the areas that will be cut out to allow the substrate to be bent to the curved shape. The five sections, such as 82, are joined near the apex and the gate and data address lines can be seen around the edge at 84 and 86. In this particular example, the segments such as 82 are laid out on a square or rectangular electronics substrate.

Some of the electronics may be included on the substrate with the address/data lines and the pixels. These electronics may include the gate shift register, a data multiplexer (MUX), data amplifiers, etc. The join of the five sections could also be made around the outer perimeter, rather than at the vertex. The sections could also be fabricated independently on individual pieces of flexible substrate and then joined together. A center join as shown in FIG. 6 results in the most compact structure. An outer perimeter join may result in easier contacts with the address lines. Further, the independent fabrication of the sections may result in higher yield, but have more issues in assembly.

As can be seen in FIG. 6, the array of pixels has a non-rectangular shape, making a non-trivial problem of rendering the array. For the sensor, the image is created in the n×m pixel matrix and displayed in an appropriate x,y form, such as on a flat screen. The transformation needed is:

$$(n \times m) \rightarrow (\theta, \phi) \rightarrow (x, y),$$

where $(\theta, \phi)$ are radial and azimuthal angels of the spherical surface.

The second transformation is:

$$x = N \cos \phi \tan \theta,$$

$$y = N \sin \Phi \tan \theta,$$

where N is an index which determines the pixel size of the display. The first transformation would be easy if the pixels in the triangular section were all identical, as it can be derived from the pixel size and angle. The transformation may still be calculated for pixels of different sizes and angles.

Figure 7:
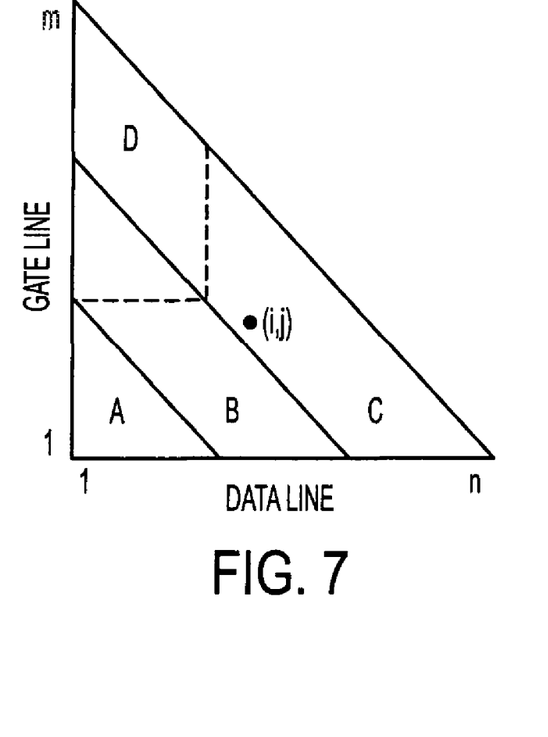
FIG. 7 shows an embodiment of a base pixel structure for a subsegment.
Figure 8:
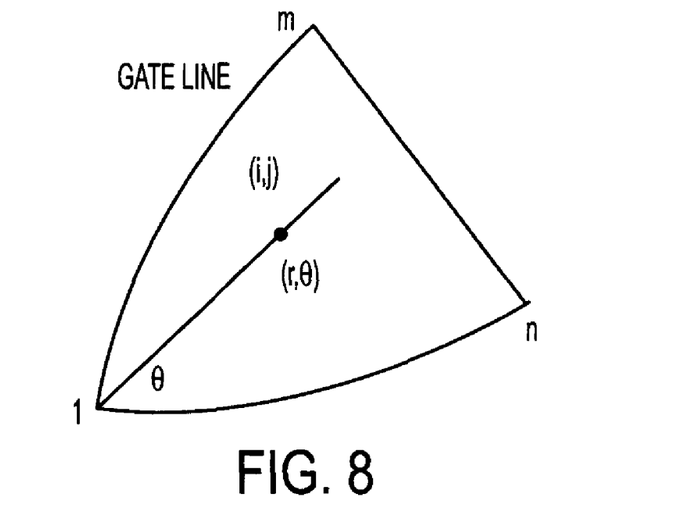
FIG. 8 shows an embodiment of a transform to transform a base pixel structure into a subsegment pixel.

FIG. 7 shows an n×m pixel arrangement for one of the segments, such as shown in FIG. 4, as it would appear on a regular x,y display. The position of the different block of pixels denoted A-D are indicated FIG. 8 illustrates the different shape of this section of pixels when it is shaped and the different shape from FIG. 7 represents the transformation $(n \times m) \rightarrow (\theta, \phi)$. For a display, the transformation would go from the flat x,y array to the curved n×m pixel arrangement on the three-dimensional surface. While this transformation is used for matrix-addressed devices, it may be applied to other types of electronic devices as well.

After processing of the arrays, where the arrays are laid out to correspond to the desired three-dimensional shape, cuts are made between the segments, such as cut 88. Cuts may also be made within each segment as necessary, such as 90. The substrate can then be 'lifted' out of the plane and shaped and bonded into the desired three-dimensional shape.

To manufacture such a device, a flexible substrate is provided. The process then forms at least one segment on the flexible substrate, the segments being from the three-dimensional shape. While the segments are not formed in the three dimensional structure prior to manufacture, the segments would more than likely modeled to cover the desired three-dimensional surface. The segments would then be divided into the subsegments. The subsegments and the segments determine how the arrays are laid out on the flexible substrate.

After the formation of the addressing lines on the substrate, and the formation of the pixel structures corresponding to the addressing lines, the flexible substrate is then cut along at least one cut line. The cut line corresponds to an edge of at least one of the subsegments within the segment. The cut lines are made to allow the flexible substrate to be curved and shaped to the desired three-dimensional shape.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method of forming a three-dimensional electronic device, comprising:
   forming an array of pixels on a flexible two-dimensional surface, the array being formed according to a three-dimensional structure, the pixels having addressing lines accessible from at least one edge of the array;
   cutting the two-dimensional surface, the cuts being located to allow the two-dimensional surface to be shaped and arranged to allow the address lines to run along an edge of the cut to an edge of the surface; and
   shaping the two-dimensional surface by lifting and bonding the substrate along the cut to form the three-dimensional surface, the array of pixels forming the three-dimensional electronic device.

2. The method of claim 1, wherein forming the array of pixels further comprises forming an array of one of either display or sensing pixels.

3. The method of claim 1, wherein cutting the two-dimensional surface comprises cutting between segments.

4. The method of claim 1, wherein cutting the two-dimensional surface comprises cutting between subsegments within a segment.

5. The method of claim 1, wherein shaping the two-dimensional surface comprises forming an approximate portion of a hemispherical surface.

6. The method of claim 1, wherein forming the array of pixels further comprises forming a two-dimensional array in segments, each segment having dedicated addressing lines.

7. The method of claim 6, wherein forming the two-dimensional array in segments comprises forming segments each having subsegments.

8. The method of claim 6, wherein each segment has a shape of one of a square, a rectangle, a triangle, a pentagon or a hexagon.

9. A three-dimensional electronic device, comprising:
a flexible substrate containing an array of pixels,
the substrate fabricated as a flat surface, then cut, and shaped and bonded along the cuts to form a three-dimensional surface;
the array of pixels covering the three-dimensional surface in subarrays corresponding to segments of the three-dimensional surface; and
addressing lines for each subarray running parallel to at lest one cut and being accessible along an edge of the three-dimensional surface.

10. The device of claim 9, the three-dimensional surface being an approximate portion of a hemisphere.

11. The device of claim 9, wherein the segments are one of squares, rectangles, triangles, pentagons, or hexagons.

12. The device of claim 9, the device further comprising joins between the segments at one of the vertex of the three-dimensional surface, a perimeter of the segments, or between individually manufactured segments.

13. The device of claim 9 wherein the pixels include a transistor connected to the addressing lines.

14. The device of claim 9 wherein the electronic device is one of a display or an image sensor.

15. A method of forming a three-dimensional electronic device comprising:
providing a flexible substrate;
forming address lines on the substrate such that the address lines are accessible at an edge of the substrate;
forming pixels on the address lines, the pixels being laid out in subarrays, the subarrays being determined by segments of a three-dimensional surface the address lines defining the subarrays;
accommodating any cuts that will allow the flexible substrate to form the three-dimensional electronic device in the forming of addressing lines and pixels;
making cuts in the flexible substrate to allow the flexible substrate to be shaped and formed to the three-dimensional surface; and
lifting the substrate to form the three-dimensional surface and bonding the substrate along the cuts.

16. The method of claim 15, wherein forming address lines comprises forming extra address lines routed in an area of the cuts.

17. The method of claim 15, wherein forming address lines comprises routing gate lines around a center of the segments.

18. The method of claim 15, wherein providing a flexible substrate comprises providing a flexible substrate for each segment, and forming address lines comprises forming address lines that will connect upon joining of the individual substrates.

19. The method of claim 15 wherein electronic signals are applied to the address lines to create a pixel image according to a predetermined transformation that is calculated from the shape of the three-dimensional surface.

* * * * *

UNITED STATES PATENT AND TRADEMARK OFFICE
CERTIFICATE OF CORRECTION

PATENT NO. : 8,077,235 B2  
APPLICATION NO. : 12/017974  
DATED : December 13, 2011  
INVENTOR(S) : Robert A. Street Page 1 of 1

It is certified that error appears in the above-identified patent and that said Letters Patent is hereby corrected as shown below:

In the Specifications:

On column 5, line 62, the equation "$y = Nsin(\Phi)tan(\theta)$" should read -- $y = Nsin(\varphi)tan(\theta)$ --.

Signed and Sealed this  
Thirteenth Day of August, 2013

Teresa Stanek Rea  
*Acting Director of the United States Patent and Trademark Office*